US010008292B1

United States Patent
Yao et al.

(10) Patent No.: US 10,008,292 B1
(45) Date of Patent: Jun. 26, 2018

(54) MEMORY AUTO REPAIRING CIRCUIT PREVENTING TRANSMISSION OF AN ENABLE SIGNAL AND ASSOCIATED METHOD

(71) Applicant: Elite Semiconductor Memory Technology Inc., Hsinchu (TW)

(72) Inventors: Tse-Hua Yao, Hsinchu County (TW); Yi-Fan Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 2 days.

(21) Appl. No.: 15/378,073

(22) Filed: Dec. 14, 2016

(51) Int. Cl.
G11C 29/00 (2006.01)
G11C 8/10 (2006.01)
G11C 8/06 (2006.01)
G11C 29/12 (2006.01)
G11C 17/16 (2006.01)

(52) U.S. Cl.
CPC .............. G11C 29/78 (2013.01); G11C 8/06 (2013.01); G11C 8/10 (2013.01); G11C 17/16 (2013.01); G11C 29/12 (2013.01)

(58) Field of Classification Search
CPC ......... G11C 29/78; G11C 17/16; G11C 29/12; G11C 8/10; G11C 8/06
See application file for complete search history.

(56) References Cited

U.S. PATENT DOCUMENTS 9,576,680 B1 * 2/2017 Lee .................. G11C 29/78
2016/0372214 A1 * 12/2016 Shim ................ G11C 29/78

* cited by examiner

Primary Examiner — Pho M Luu
Assistant Examiner — Jerome Leboeuf
(74) Attorney, Agent, or Firm — Winston Hsu

(57) ABSTRACT

A memory auto repairing circuit including: a decoding circuit, a latch enable circuit and a first latch circuit, wherein the decoding circuit is arranged to compare a first input address with a plurality of fail addresses to generate a control signal; the latch enable circuit is arranged to selectively generate a first enable signal at least according to the control signal; and the first latch circuit is arranged to receive the first input address, and store the first input address when the first enable signal is received by the first latch circuit; wherein when the control signal indicates that the first input address is identical to one of the plurality of fail addresses, the enable signal is prevented from being transmitted from the latch enable circuit to the first latch circuit.

20 Claims, 4 Drawing Sheets

MEMORY AUTO REPAIRING CIRCUIT PREVENTING TRANSMISSION OF AN ENABLE SIGNAL AND ASSOCIATED METHOD

BACKGROUND OF THE INVENTION

1. Field of the Invention

The present invention relates to a memory auto repairing circuit and an associated method.

2. Description of the Prior Art

Conventional memory requires two testing stages before leaving the factory; for example, a Chip Probing (CP) mode and a Final Test (FT) mode are executed to test memories. During a typical testing process, when a word line corresponding to an input address is found defective, a redundancy word line is accessed to repair the defective word line. When a word line corresponding to a specific address is found defective, there is a good chance that two different redundancy word lines will be used for the specific address during the CP mode and the Final mode, causing a multi-selection problem. In addition, certain problems need to be fixed during the FT mode. Therefore, a novel memory auto repairing circuit design is desired.

SUMMARY OF THE INVENTION

One of the objectives of the present invention is to provide a memory auto repairing circuit and an associated method to solve the abovementioned problems.

According to an embodiment of the present invention, a memory auto repairing circuit is disclosed, comprising: a decoding circuit, a latch enable circuit and a first latch circuit, wherein the decoding circuit is arranged to compare a first input address with a plurality of fail addresses to generate a control signal; the latch enable circuit is arranged to selectively generate a first enable signal at least according to the control signal; and the first latch circuit is arranged to receive the first input address, and store the first input address when the first enable signal is received by the first latch circuit; wherein when the control signal indicates that the first input address is identical to one of the plurality of fail addresses, the enable signal is prevented from being transmitted from the latch enable circuit to the first latch circuit.

According to an embodiment of the present invention, a memory auto repairing method is disclosed, comprising: comparing a first input address with a plurality of fail addresses to generate a control signal; selectively generating a first enable signal at least according to the control signal; and utilizing a first latch circuit to receive the first input address, and store the first input address when the first enable signal is received by the first latch circuit; wherein when the control signal indicates that the first input address is identical to one of the plurality of fail addresses, the enable signal is prevented from being transmitted to the first latch circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
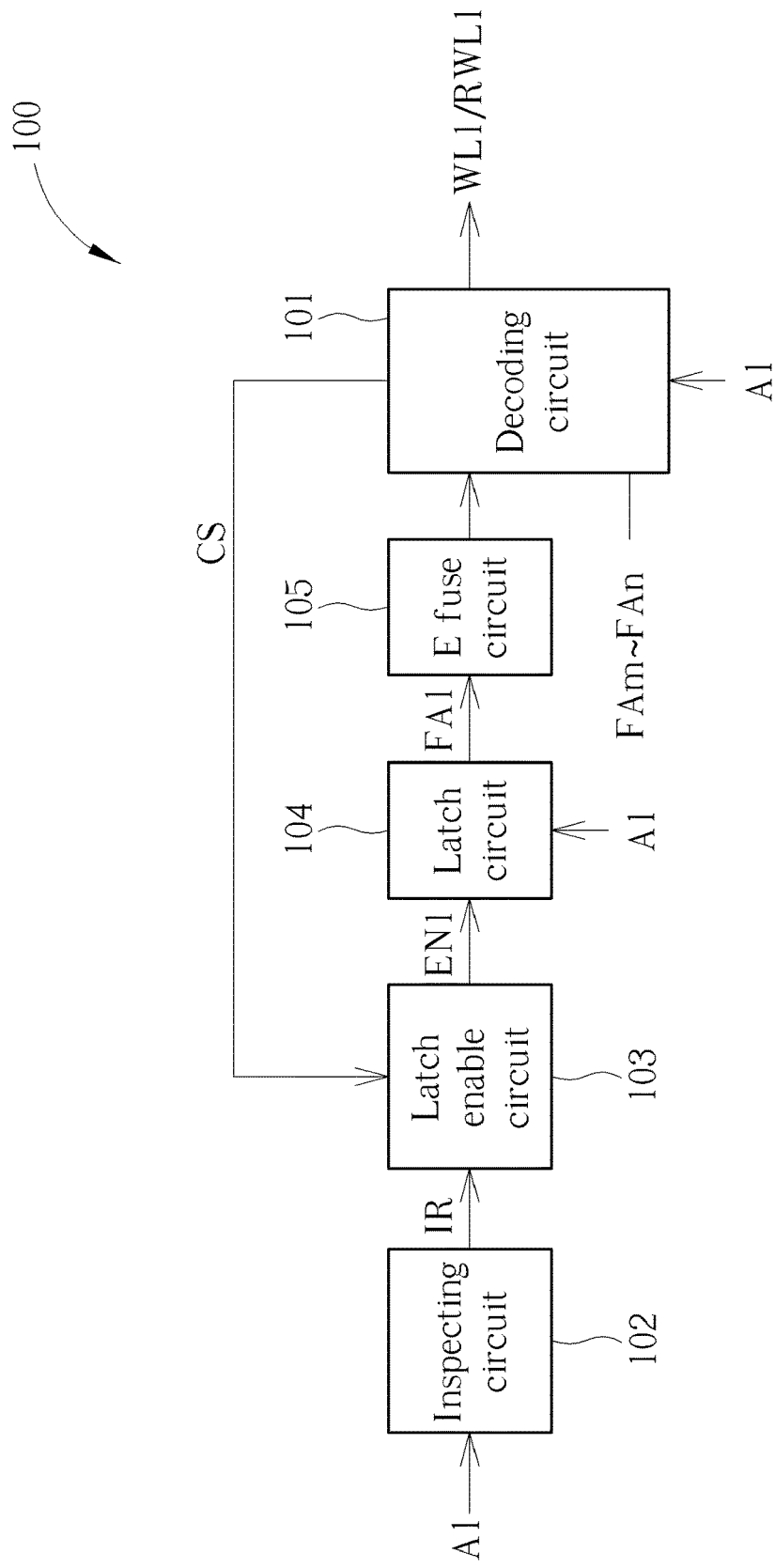
FIG. 1 is a diagram illustrating a memory auto repairing circuit according to a first embodiment of the present invention.

FIG. 1 is a diagram illustrating a memory auto repairing circuit 100 according to a first embodiment of the present invention. As shown in FIG. 1, the memory auto repairing circuit 100 comprises a decoding circuit 101, an inspecting circuit 102, a latch enable circuit 103, a latch circuit 104, and an E-fuse circuit 105. The decoding circuit 101 is arranged to receive an input address, e.g. an address A1 shown in FIG. 1, and decode the address A1 to determine if the address A1 corresponds to one of fail addresses FAm-FAn. If the address A1 corresponds to one of the fail addresses FAm-FAn, a redundancy word line previously allocated to the fail address will be accessed. It should be noted that the fail addresses FAm-FAn are usually stored in a plurality of E-fuse circuits. For clarity and simplicity, only the E-fuse circuit 104 relevant to this embodiment is depicted in FIG. 1. The decoding circuit 101 is further arranged to generate a control signal CS when the address A1 corresponds to one of the fail addresses FAm-FAn. The inspecting circuit 102 is arranged to receive and inspect the address A1 to determine if the address A1 corresponds to a defective word line, and generate an inspecting result IR to the latch enable circuit 103. It should be noted that, in other embodiments, the inspecting circuit 102 is not limited to be installed in the memory auto repairing circuit 100. Furthermore, the inspecting circuit 102 can be implemented in any form, e.g. in hardware, software, or firmware. The latch enable circuit 103 is arranged to selectively generate an enable signal EN1 according to the control signal CS and the inspecting result IR. When the control signal CS is received by the latch enable circuit 103, i.e. the address A1 corresponds to one of the fail addresses FAm-FAn, the latch enable circuit 103 prevents the enable signal EN1 from being transmitted. When the inspecting result IR indicates that the address A1 does not correspond to a defective word line, the latch enable circuit 103 prevents the enable signal EN1 from being transmitted. In other cases, the enable signal EN1 is transmitted from the latch enable circuit 103 to the latch circuit 104. The latch circuit 104 is arranged to receive the address A1, and further arranged to store the address A1 into the E-fuse circuit 105 as a fail address FA1 when the enable signal EN1 is received by the latch circuit 104. If the address A1 is stored into the E-fuse circuit as the fail address FA1, a redundancy word line RWL1 allocated to the fail address FA1 is accessed when the decoding circuit 201 accesses the address A1.

Three different conditions should be considered with respect to the embodiment of FIG. 1. Firstly, when the address A1 does not correspond to any of the fail addresses FAm-FAn previously stored and the inspecting result IR indicates that the address A1 does not correspond to a defective word line, the enable signal EN1 is prevented from being transmitted to the latch circuit 104. The latch circuit 104 refuses to store the address A1, and the decoding circuit 101 decodes the address A1 and accesses a normal word line WL1 corresponding to the address A1. Secondly, when the address A1 corresponds to one of the fail addresses Fam-Fan, the control signal CS is generated to the latch enable circuit 103. In this way, the enable signal EN1 is prevented from being transmitted to the latch circuit 104. The latch circuit 104 refuses to store the address A1, and the decoding circuit 101 decodes the address A1 and accesses the redundancy word line previously allocated to the fail address. Lastly, when the address A1 does not correspond to any of the fail addresses Fam-Fan and the inspecting result IR indicates that the address A1 corresponds to a defective word line, the latch enable circuit 103 generates the enable signal EN1 to the latch circuit 104. In this way, the latch circuit stores the address A1 into the E-fuse circuit 105 as the fail address FA1. The decoding circuit 101 decodes the address A1 and accesses the redundancy word line RWL1 specified to the fail address FA1.

Figure 2:
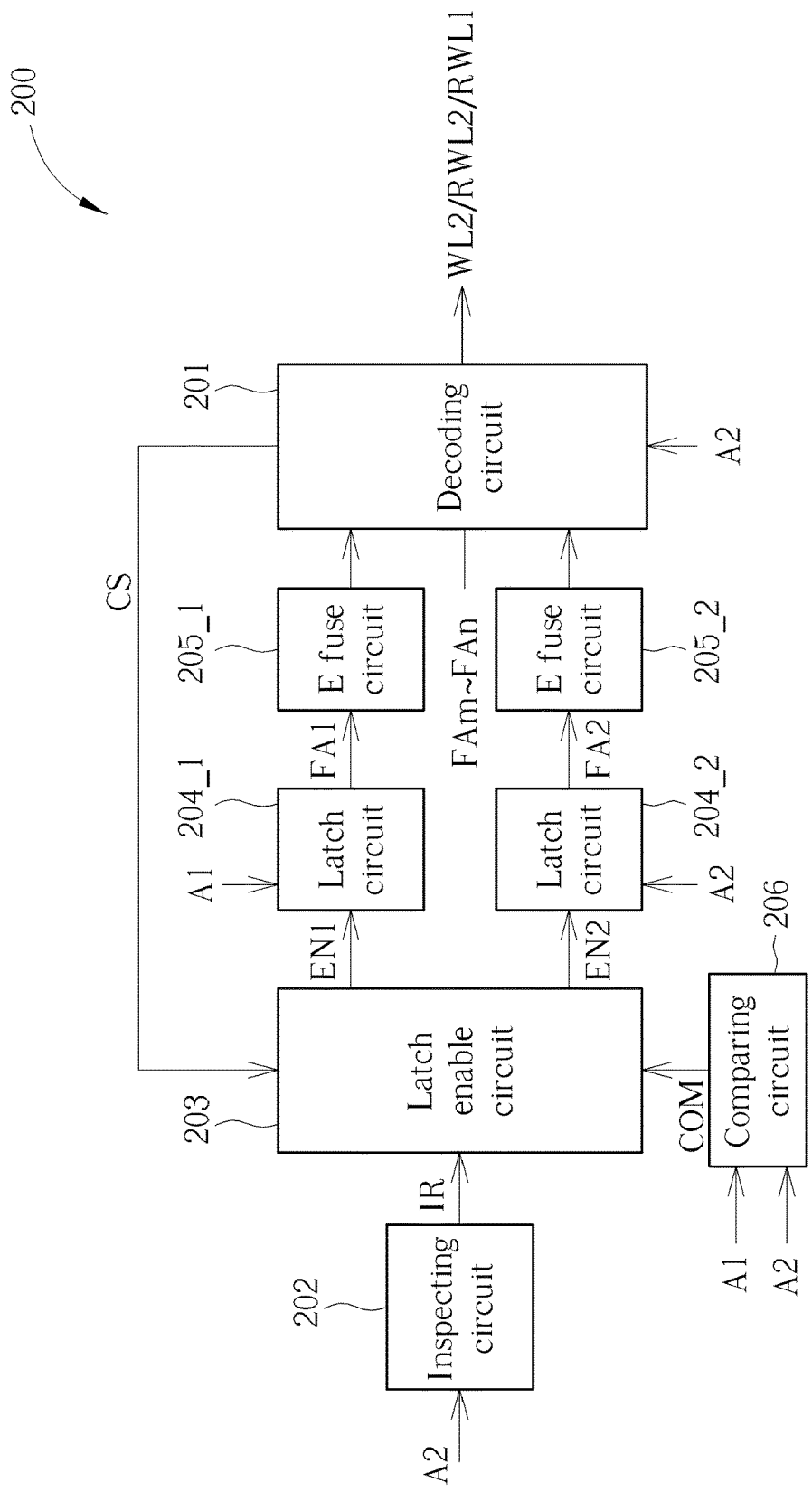
FIG. 2 is a diagram illustrating a memory auto repairing circuit according to a second embodiment of the present invention.

FIG. 2 is a diagram illustrating a memory auto repairing circuit 200 according to a second embodiment of the present invention. The memory auto repairing circuit 200 comprises a decoding circuit 201, an inspecting circuit 202, a latch enable circuit 203, latch circuits 204_1 and 204_2, E-fuse circuits 205_1 and 205_2, and a comparing circuit 206. In this embodiment, the address A1 has been stored into the latch circuit 204_1 according to the enable signal EN1 as in the embodiment of FIG. 1. The decoding circuit 201 is arranged to receive an input address, e.g. an address A2 shown in FIG. 2, and decode the address A2 to determine if the address A2 corresponds to one of the fail addresses FAm-FAn. If the address A2 corresponds to one of the fail addresses FAm-FAn, the redundancy word line previously allocated to the fail address is accessed. As mentioned in the embodiment of FIG. 1, the decoding circuit 201 is further arranged to generate the control signal CS when the address A2 corresponds to any of the fail addresses FAm-FAn. The inspecting circuit 202 is arranged to receive and inspect the address A2 to determine if the address A2 corresponds to a defective word line, and generate the inspecting result IR to the latch enable circuit 203. The comparing circuit 206 is arranged to compare the addresses A1 and A2, and generates a comparing result COM. The latch enable circuit 203 is arranged to selectively generate an enable signal EN2 according to the control signal CS, the inspecting result IR, and the comparing result COM. When the control signal CS is received by the latch enable circuit 203, i.e. the address A2 corresponds to one of the fail addresses FAm-FAn, the latch enable circuit 203 prevents the enable signal EN2 from being transmitted. When the inspecting result IR indicates that the address A2 does not correspond to a defective word line, the latch enable circuit 203 also prevents the enable signal EN1 from being transmitted. When the comparing result COM indicates that the address A2 is identical to the address A1 which has been stored into the latch circuit 204_1, the latch enable circuit 203 prevents the enable signal EN2 from being transmitted. In other cases, the enable signal EN2 is transmitted from the latch enable circuit 203 to the latch circuit 204_2. The latch circuit 204_2 is arranged to receive the address A2, and further arranged to store the address A2 into the E-fuse circuit 205_2 as a fail address FA2 when the enable signal EN2 is received by the latch circuit 204_2. If the address A2 is stored into the E-fuse circuit 205_2 as the fail address FA2, a redundancy word line RWL2 allocated to the fail address FA2 is accessed when the decoding circuit 201 accesses the address A2.

Four different conditions should be considered with respect to the embodiment of FIG. 2. Firstly, when the comparing result COM indicates that the address A2 is not identical to the address A1, the address A2 does not correspond to any of the fail addresses FAm-Fan, and the inspecting result IR indicates that the address A2 does not correspond to a defective word line, the enable signal EN2 is prevented from being transmitted to the latch circuit 204_2. The latch circuit 204_2 refuses to store the address A2, and the decoding circuit 201 decodes the address A2 and accesses a normal word line WL2 corresponding to the address A2. Secondly, when the comparing result COM indicates that the address A2 is not identical to the address A1, and the address A2 corresponds to one of the fail addresses Fam-Fan, the control signal CS is generated to the latch enable circuit 203. In this way, the enable signal EN2 is prevented from being transmitted to the latch circuit 204_2. The latch circuit 204_2 refuses to store the address A2, and the decoding circuit 201 decodes the address A2 and accesses the redundancy word line previously allocated to the fail address. Thirdly, when the comparing result COM indicates that the address A2 is not identical to the address A1, the address A2 does not correspond to any of the fail addresses Fam-Fan, and the inspecting result IR indicates that the address A2 corresponds to a defective word line, the latch enable circuit 203 generates the enable signal EN2 to the latch circuit 204_2. In this way, the latch circuit 204_2 stores the address A2 into the E-fuse circuit 205_2 as a fail address FA2. The decoding circuit 201 decodes the address A2 and accesses a redundancy word line RWL2 allocated to the fail address FA2. Lastly, when the comparing result COM indicates that the address A2 is identical to the address A1, the enable signal EN2 is prevented from being transmitted to the latch circuit 204_2. The latch circuit 204_2 refuses to store the address A2, and the decoding circuit 201 decodes the address A2 and accesses the redundancy word line RWL1 specified to the fail address FA1. By using the control signal CS and the comparing result COM, the multi-selection issue can be effectively solved.

Figure 3:
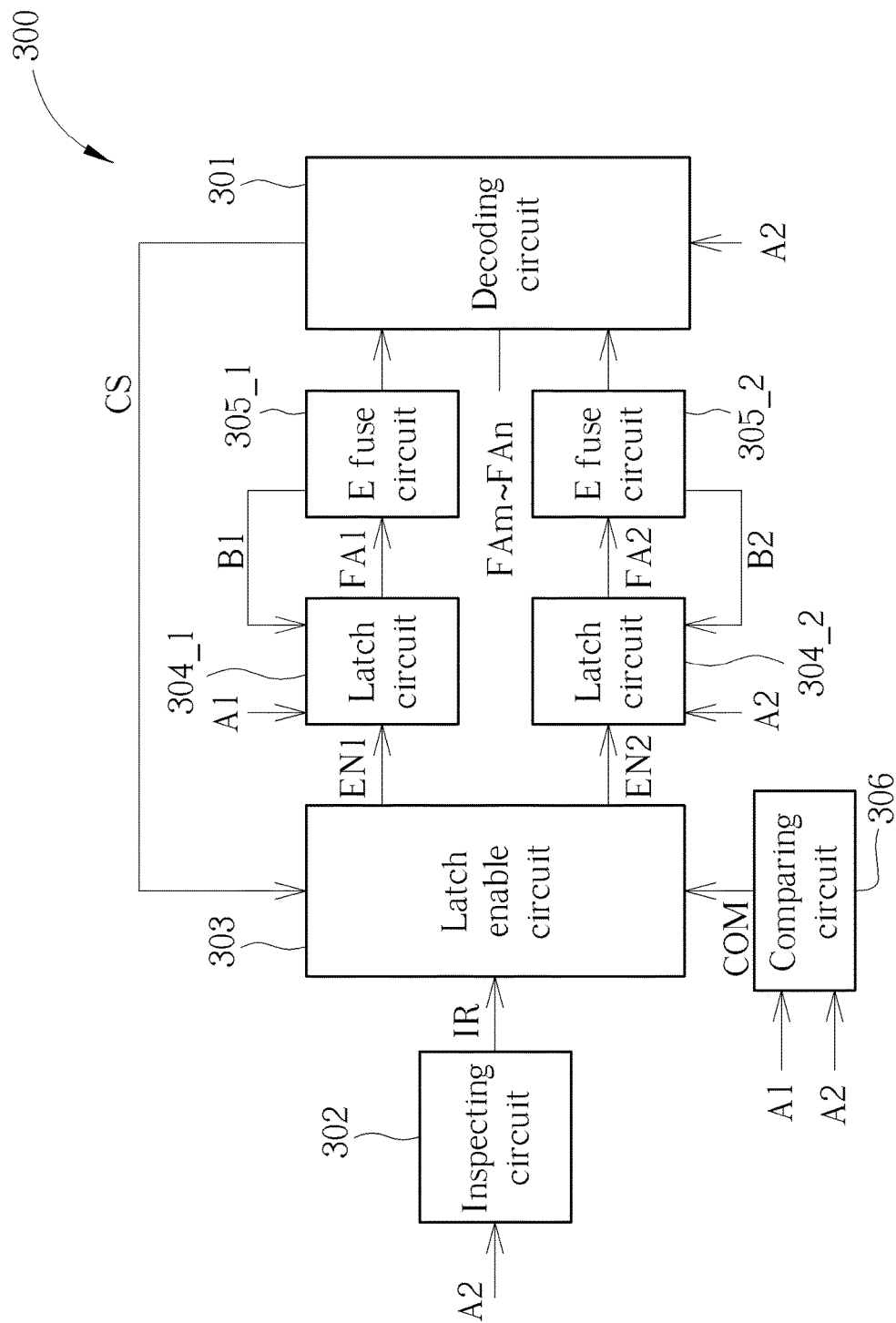
FIG. 3 is a diagram illustrating a memory auto repairing circuit according to a third embodiment of the present invention.

FIG. 3 is a diagram illustrating a memory auto repairing circuit 300 according to a third embodiment of the present invention. The memory auto repairing circuit 300 comprises a decoding circuit 301, an inspecting circuit 302, a latch enable circuit 303, latch circuits 304_1 and 304_2, E-fuse circuits 305_1 and 305_2, and a comparing circuit 306, wherein the functions of the decoding circuit 301, the inspecting circuit 302, the latch enable circuit 303, the latch circuits 304_1 and 304_2, the E-fuse circuits 305_1 and 305_2, and the comparing circuit 306 are similar/identical to those described in the embodiment of FIG. 2. The only difference is the E-fuse circuit 305_1 is further arranged to generate a burned signal B1 to the latch circuits 304_1 when the address A1 is stored into the E-fuse circuit 305_1 as the fail address FA1. Once the burned signal B11 is received by the latch circuit 304_1, the latch circuit 304_1 will no longer store any input address. Likewise, the E-fuse circuit 305_2 is further arranged to generate a burned signal B2 to the latch circuits 304_2 when the address A2 is stored into the E-fuse circuit 305_2 as the fail address FA2. Once the burned signal B2 is received by the latch circuit 304_2, the latch circuit 304_2 will no longer store any input address.

When the memory auto repairing circuit 300 is powered off and then powered on again, the latch circuits 304_1 and 304_2 are notified if the E-fuse circuits 305_1 and 305_2 store the fail addresses FA1 and FA2 by the burned signals B1 and B2. Other fail addresses will not be written to the E-fuse circuits 305_1 and 305_2, thereby preventing the multi-selection problem.

Figure 4:
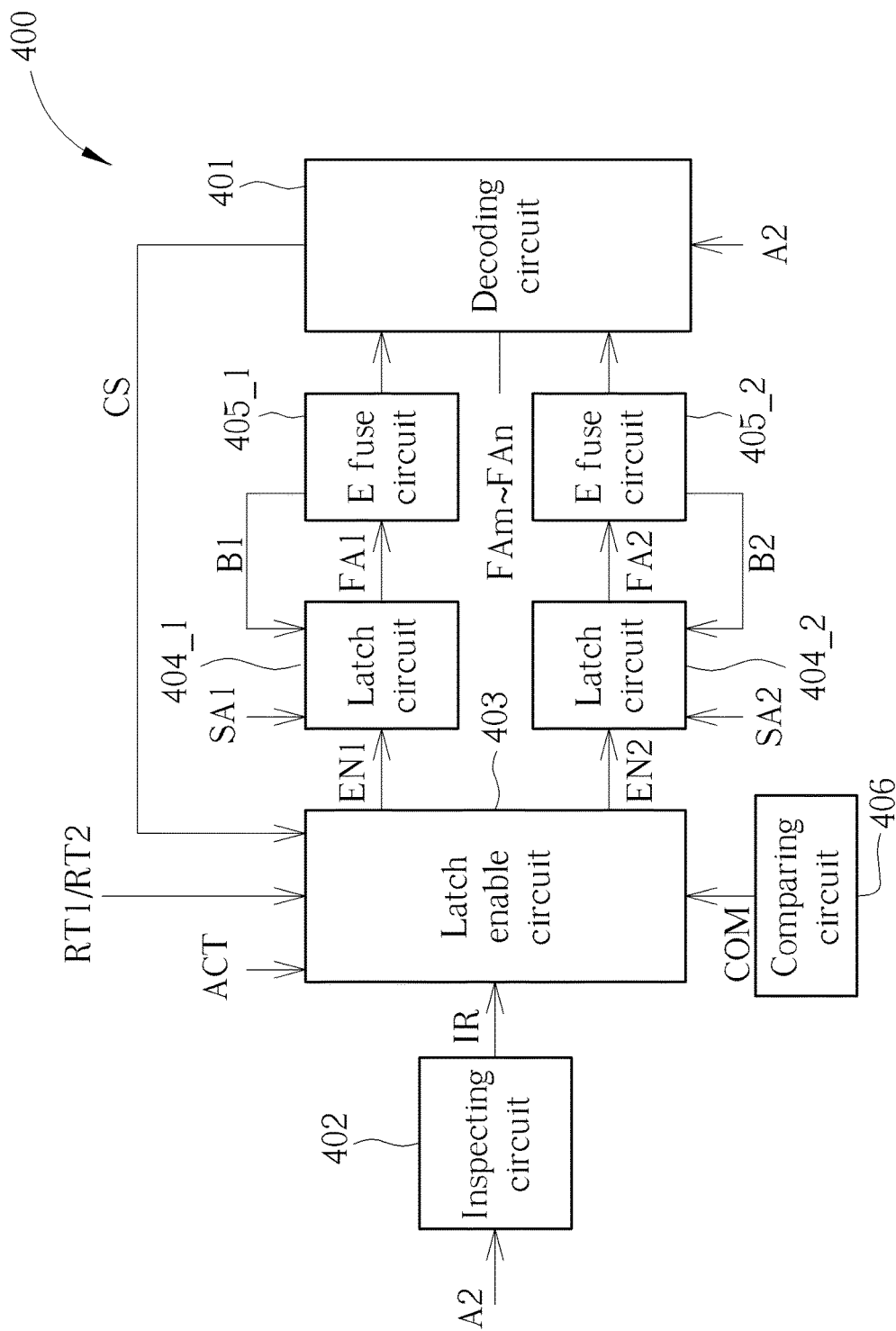
FIG. 4 is a diagram illustrating a memory auto repairing circuit according to a fourth embodiment of the present invention.

FIG. 4 is a diagram illustrating a memory auto repairing circuit 400 according to a third embodiment of the present invention. The memory auto repairing circuit 400 comprises a decoding circuit 401, an inspecting circuit 402, a latch enable circuit 403, latch circuits 404_1 and 404_2, E-fuse circuit 405_1 and 405_2, and a comparing circuit 406, wherein the functions of the decoding circuit 401, the inspecting circuit 402, the latch enable circuit 403, the latch circuits 404_1 and 404_2, the E-fuse circuits 405_1 and 405_2, and the comparing circuit 406 are similar/identical to those described in the embodiments of FIG. 2 and FIG. 3. The only difference is that the latch circuit 404_1 or 404_2 is used to store a specific address (e.g. specific addresses SA1 or SA2 shown in FIG. 4), rather than the addresses A1 or A2. Referring to FIG. 4, the latch enable circuit 403 receives an active command ACT and test mode commands RT1/RT2 which indicate that the memory auto repairing circuit 400 enters a specific test mode. During the specific test mode, the latch enable circuit 403 ignores the inspecting result IR and the comparing result COM, generates the enable signal EN1 in response to the test mode command RT1, and generates the enable signal EN2 in response to the test mode command RT2. Then, when the enable signal EN1 is activated, the latch circuit 404_1 stores one specific address SA1 which is designated when the active command ACT is issued. When the enable signal EN2 is activated, the latch circuit 404_2 stores the other specific address SA2 which is designated when the active command ACT is issued. In this embodiment, the specific addresses SA1 and SA2 can be stored unless the latch circuits 404_1 and 404_2 receives the burned signals B1 and B2 from the E-fuse circuits 405_1 and 405_2, respectively. This is only for illustrative purpose, however, and not a limitation of the present invention.

In the above description, an example in which the address input to the latch circuit is a row address, corresponding to a word line has been described. However, the address input to the latch circuit may be a column address, corresponding to a bit line. In the latter case, the operation of the memory auto repairing circuit is the same as that described above, and a description thereof is omitted.

It should be noted that the numbers of the latch circuits and the E-fuse circuits installed in the memory auto repairing circuits 100-400 are only for illustrative purposes. In other embodiments, the memory auto repairing circuit can comprise more than two latch circuits. These alternative designs also fall within the scope of the present invention.

Briefly Summarized, by using the control signal CS from the decoding circuits 101-401, the comparing result COM from the comparing circuits 206-406, and the burned signals from the E-fuse circuit 305_1, 305_2, 405_1 and 405_2, the multi-selection problem can be effectively solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory auto repairing circuit, comprising:
    a decoding circuit, arranged to compare a first input address with a plurality of fail addresses to generate a control signal;
    a latch enable circuit, arranged to selectively generate a first enable signal at least according to the control signal; and
    a first latch circuit, arranged to receive the first input address, and store the first input address when the first enable signal is received by the first latch circuit;
    wherein when the control signal indicates that the first input address is identical to one of the plurality of fail addresses, the enable signal is prevented from being transmitted from the latch enable circuit to the first latch circuit.

2. The memory auto repairing circuit of claim 1, further comprising:
    a comparing circuit, arranged to compare the first input address and a second input address to generate a comparing signal to the latch enable circuit;
    wherein when the comparing signal indicates that the first input address is not identical to the second input address, the latch enable circuit generates a second enable signal.

3. The memory auto repairing circuit of claim 2, further comprising:
    a second latch circuit, arranged to receive the second input address after the first input address is stored by the first latch circuit, and store the second input address when the second enable signal is received by the second latch circuit.

4. The memory auto repairing circuit of claim 3, further comprising:
    a first E-fuse circuit, wherein the first latch circuit stores the first input address into the first E-fuse circuit as a first fail address when the first enable signal is received by the first latch circuit; and
    a second E-fuse circuit, wherein the second latch circuit stores the second input address into the second E-fuse circuit as a second fail address when the second enable signal is received by the second latch circuit.

5. The memory auto repairing circuit of claim 4, wherein the first E-fuse circuit generates a first burned signal to the first latch circuit when the first E-fuse circuit stores the first input address as the first fail address, and the second E-fuse circuit generates a second burned signal to the second latch circuit when the second E-fuse circuit stores the second input address as the second fail address.

6. The memory auto repairing circuit of claim 5, wherein the first latch circuit no longer receives any input address after receiving the first burned signal from the first E-fuse circuit, and the second latch circuit no longer receives any input address after receiving the second burned signal from the second E-fuse circuit.

7. The memory auto repairing circuit of claim 2, wherein the latch enable circuit ignores the comparing signal and generates the first enable signal when an active command and a test mode commands are received by the latch enable circuit, and when the first enable signal is activated, the first latch circuit stores a specific address which is designated when the active command is issued.

8. The memory auto repairing circuit of claim 1, wherein when the control signal indicates that the first input address is identical to one of the plurality of fail addresses, the memory auto repairing circuit accesses a redundancy line according to the first input address.

9. The memory auto repairing circuit of claim 1, wherein when the control signal indicates that the first input address is not identical to any fail address, the memory auto repairing circuit accesses a normal line according to the first input address.

10. The memory auto repairing circuit of claim 1, further comprising:
an inspecting circuit, arranged to check a normal line corresponding to the first input address, and generate an inspecting signal to the latch enable circuit;
wherein the latch enable circuit generates the first enable signal when the inspecting signal indicates that the normal line corresponding to the first input address is defective.

11. A memory auto repairing method, comprising:
comparing a first input address with a plurality of fail addresses to generate a control signal;
selectively generating a first enable signal at least according to the control signal; and
utilizing a first latch circuit to receive the first input address, and store the first input address when the first enable signal is received by the first latch circuit;
wherein when the control signal indicates that the first input address is identical to one of the plurality of fail addresses, the enable signal is prevented from being transmitted to the first latch circuit.

12. The memory auto repairing method of claim 11, further comprising:
comparing the first input address and a second input address to generate a comparing signal;
wherein when the comparing signal indicates that the first input address is not identical to the second input address, a second enable signal is generated.

13. The memory auto repairing method of claim 12, further comprising:
utilizing a second latch circuit to receive the second input address after the first input address is stored by the first latch circuit, and store the second input address when the second enable signal is received by the second latch circuit.

14. The memory auto repairing method of claim 13, further comprising:
utilizing a first E-fuse circuit to store the first input address as a first fail address when the first enable signal is received; and
utilizing a second E-fuse circuit to store the second input address as a second fail address when the second enable signal is received.

15. The memory auto repairing method of claim 14, wherein the first E-fuse circuit generates a first burned signal to the first latch circuit when the first E-fuse circuit stores the first input address as the first fail address, and the second E-fuse circuit generates a second burned signal to the second latch circuit when the second E-fuse circuit stores the second input address as the second fail address.

16. The memory auto repairing method of claim 15, wherein the first latch circuit no longer receives any input address after receiving the first burned signal from the first E-fuse circuit, and the second latch circuit no longer receives any input address after receiving the second burned signal from the second E-fuse circuit.

17. The memory auto repairing method of claim 11, further comprising:
ignoring the comparing signal and generating the first enable signal when an active command and a test mode commands are received by the latch enable circuit, and when the first enable signal is activated, the first latch circuit stores a specific address which is designated when the active command is issued.

18. The memory auto repairing method of claim 11, wherein when the control signal indicates that the first input address is identical to one of the plurality of fail addresses, a redundancy line is accessed according to the first input address.

19. The memory auto repairing method of claim 11, wherein when the control signal indicates that the first input address is not identical to any fail address, a normal line is accessed according to the first input address.

20. The memory auto repairing method of claim 11, further comprising:
checking a normal line corresponding to the first input address and generating an inspecting signal; and
generating the first enable signal when the inspecting signal indicates that the normal line corresponding to the first input address is defective.

* * * * *